Nov. 10, 1970 D. A. CROWE 3,539,827

FREQUENCY SELECTIVE CIRCUIT

Filed Jan. 17, 1968 2 Sheets-Sheet 1

DALE A. CROWE
INVENTOR

BY

BUCKHORN, BLORE, KLARQUIST & SPARKMAN
ATTORNEYS

FREQUENCY SELECTIVE CIRCUIT

Filed Jan. 17, 1968 2 Sheets-Sheet 2

DALE A. CROWE
INVENTOR
BY
BUCKHORN, BLORE, KLARQUIST & SPARKMAN
ATTORNEYS

United States Patent Office 3,539,827
Patented Nov. 10, 1970

3,539,827
FREQUENCY SELECTIVE CIRCUIT
Dale A. Crowe, Sedro Woolley, Wash., assignor to Rothenbuhler Engineering Co., Woolley, Wash., a corporation of Washington
Filed Jan. 17, 1968, Ser. No. 698,617
Int. Cl. H03k 5/20
U.S. Cl. 307—233 10 Claims

ABSTRACT OF THE DISCLOSURE

A frequency selective circuit comprises a monostable multivibrator which is triggered via triggering means from an alternating current waveform. The output of the multivibrator is coupled to integrating means so that, as the frequency of the input waveform increases, the integrated output increases until the quasi-stable period of the multivibrator approximates the period of the input waveform. However, at higher input frequencies the integrated output of the multivibrator decreases, the multivibrator being re-triggered to its stable state by triggering means responsive to the input waveform. As a result, a peak output is produced corresponding to a given input frequency or frequency range, and the circuit does not respond at harmonic frequencies.

BACKGROUND OF THE INVENTION

In small radio receivers used for paging and the like, a portion of the receiver is frequently continuously energized and tuned to a master transmitter. When a particular receiver is to be paged, audio or supersonic tone modulation is transmitted for the purpose of energizing the remainder of the receiver and/or providing an indication to the person being paged. In order to render the paging receiver responsive to a given audio or supersonic modulation, conventional tuned circuits responsive to such modulation are usually employed. However, at audio frequencies inductors and capacitors are unfortunately quite bulky and frequently consume more space than the rest of the receiver. In particular, such tuned circuits are not adaptable to miniaturization by integrated or printed circuit techniques, and add not only to the bulk, but also to the cost of the equipment.

Other frequency responsive elements may be substituted for a conventional inductor and a capacitor. For example, a piezoelectric crystal can be employed as a responsive element. However, a device of this type also adds to the bulk and expense of the equipment. Pulse circuitry or gate circuitry can also be employed to analyze the frequency of an input waveform, but circuitry of this type is usually either quite complicated, or is ambiguous in its response with respect to frequency. For example, the same output may be produced at multiples or harmonics of the input frequency.

SUMMARY OF THE INVENTION

In accordance with the present invention, a triggerable means, for example a monostable multivibrator, is operated in response to triggering signals derived from an input waveform. Output means, responsive to the output of the multivibrator, produces an indication when the spacing between triggering signals approaches a predetermined time period, for example, the duration of the multivibrator's quasi-stable state. In a preferred embodiment the output of the multivibrator is integrated, and such integrated output increases as the pulses produced by the multivibrator become more closely spaced. However, as the frequency of the input increases to the extent that the spacing between triggering signals becomes less than a predetermined period, means reset the multivibrator to its stable state at the occurrence of every other triggering signal. Thus for frequencies above a predetermined frequency, the multivibrator will be in its quasi-stable condition for only half the time. The circuit is thereby rendered responsive at only one frequency or range of frequencies and is rendered nonresponsive to multiples thereof. The frequency selective circuit according to the present invention employs substantially no unwieldly tuned circuit components and yet is unambiguously responsive to selected input frequencies.

It is accordingly an object of the present invention to provide an improved frequency selective circuit which does not employ conventional tuned circuit elements.

It is another object of the present invention to provide an improved frequency selective circuit avoiding the use of conventional tuned circuit elements, and which provides a nonambiguous output in response to a predetermined frequency input.

It is another object of the present invention to provide an improved frequency selective circuit which is economical and compact in construction, and which is capable of adjustment in regard to frequency and selectivity.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figure 1:
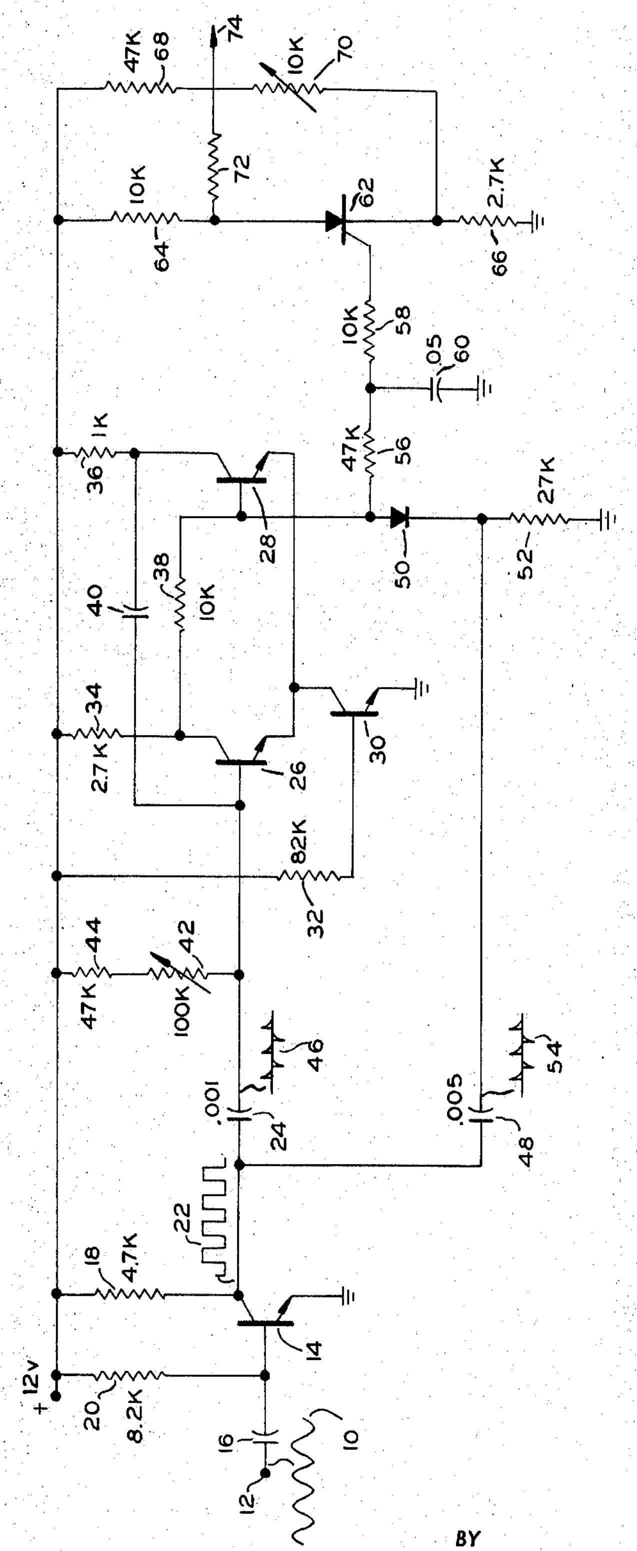
FIG. 1 is a schematic diagram of a frequency selective circuit according to the present invention.

Referring to FIG. 1, an input wave form 10, which may constitute audio or supersonic modulation detected in a conventional radio receiver, is applied at terminal 12 and is coupled to the base of NPN transistor 14 through coupling capacitor 16. The emitter of transistor 14 is grounded, and the collector and base thereof are returned to a positive voltage by means of resistors 18 and 20, respectively. Transistor 14 comprises a limiting amplifier, being overdriven so that it produces an output 22 at the collector thereof which is a severely clipped or square-wave version of input waveform 10.

The collector of transistor 14 is coupled through capacitor 24 to a control terminal, i.e. the base terminal, of a first controlled device here comprising NPN transistor 26. A second controlled device, comprising NPN transistor 28, is cross coupled to the first to complete a triggerable means, here taking the form of a monostable multivibrator. The emitter electrodes of both transistors 26 and 28 are connected together and returned to ground via the collector electrode of current source NPN transistor 30, thus providing emitter coupling between the transistor. The emitter of transistor 30 is grounded, while the base thereof is connected to a positive voltage by means of resistor 32. The collector electrodes of transistors 26 and 28 are returned to a positive voltage by resistors 34 and 36 respectively, while the collector of transistor 26 is coupled to the base of transistor 28 by means of resistor 38. Also, the collector of transistor 28 is coupled to the control electrode or base of transistor 26 by capacitor 40. The base of transistor 26 is returned to a positive voltage through the series connection of variable resistor 42 and resistor 44. Capacitor 24, together with resistors 42 and 44 forms a differentiating means repetitively responsive to the alternating current input to provide triggering signals 46 at the input of the multivibrator.

A reset circuit for the multivibrator includes a capacitor 48 having one terminal thereof connected to the collector of transistor 14 and the opposite terminal thereof connected to the base of transistor 28 through diode 50. The junction between capacitor 48 and diode 50 is returned to ground by resistor 52. This reset circuit thus includes a second differentiating means comprising capacitor 48 and resistor 52 for providing triggering signals 54 in response to clipped waveform 22, these triggering signals being quite similar to and in phase with triggering signals 46. Diode 50 is poled with its anode connected to the base of transistor 28 and with its cathode connected to capacitor 48 whereby only negative-going triggering signals reach the base of transistor 28 so that positive-going triggering signals will not trigger the multivibrator. These negative-going triggering signals perform a resetting function as will hereinafter become more evident.

An integrating circuit, including resistors 56 and 58 connected in series and further including a capacitor 60 connected from their midpoint to ground, is interposed between the base of transistor 28 and the input or gate electrode of a voltage responsive means comprising silicon-controlled rectifier 62. The anode of silicon-controlled rectifier 62 is connected to a positive voltage through resistor 64 and the cathode thereof is returned to ground by means of resistor 66. A selectivity adjusting circuit comprising resistors 68 and variable resistor 70 is connected between the positive voltage source and the cathode of silicon-controlled rectifier 62, while an output resistor 72 connects the cathode of rectifier 62 to an output terminal indicated at 74. The voltage applied by resistors 66, 68, and 70 at the cathode electrode of silicon-controlled rectifier 62 is such that the rectifier is normally biased in an off condition.

Typical component values are given in the circuit diagram, with resistance being given in ohms, and with the capacitance values being given in microfarads. These values are illustrative only.

The normal state for the multivibrator is such that transistor 26 is conducting and transistor 28 is nonconducting. At this time, collector current flows through resistor 34 dropping the voltage at the collector and at the base of transistor 28, the base of transistor 28 being essentially connected to the midpoint of a voltage divider comprising resistors 38 and 52 interposed between the collector of transistor 26 and ground. When an input waveform 10 is applied at terminal 12, the clipped version 22 thereof is differentiated to provide the triggering signals 46. A negative triggering signal is effective to momentarily lower the voltage at the base of transistor 26 and turn this transistor off. The voltage at the collector of transistor 26 then rises, raising the voltage at the base of transistor 28 through resistor 38, and turning on transistor 28. As a result, the collector of transistor 28 drops in voltage. The voltage across capacitor 40 cannot immediately change, and therefore a further negative voltage is applied to the base of transistor 26 for maintaining the latter negatively biased until the capacitor can discharge through resistors 42 and 44. Transistor 28 will continue to conduct, and transistor 26 will continue in an off condition for a period of time defined by the time constant of the capacitor 40, resistor 42 and 44 combination, and the multivibrator is then said to be in a quasi-stable state. Capacitor 40 and resistors 42 and 44 comprise the frequency-determining feedback circuit of the present invention. The duration of th quasi-stable state as determined by the aforementioned feedback circuit may be adjusted by means of variable resistor 42.

At the conclusion of the quasi-stable state, the multivibrator returns to the stable condition wherein transistor 26 conducts and transistor 28 is non-conducting. Each occurrence of a negative triggering signal will then produce the same cycle of operation, providing the input frequency is within certain limits, and an output of predetermined duration corresponding to the multivibrator's quasi-stable state will be repetitively produced. In the preferred circuit, the multivibrator output is taken at the base of transistor 28, and this output is integrated by integrating means comprising resistors 56 and 58 and capacitor 60. the integrating means is cumulatively responsive to the output of the monostable multivibrator whereby the charge on capacitor 60 increases as the cumulative time during which the monostable vibrator is triggered to its quasi-stable state increases. When the integrated voltage on capacitor 60 reaches a predetermined value, the silicon-controlled rectifier 62 will be triggered into conduction and will provide a negative-going output at output terminal 74. The voltage at which such triggering will take place is adjustable by adjusting the value of resistor 70.

Figure 3:
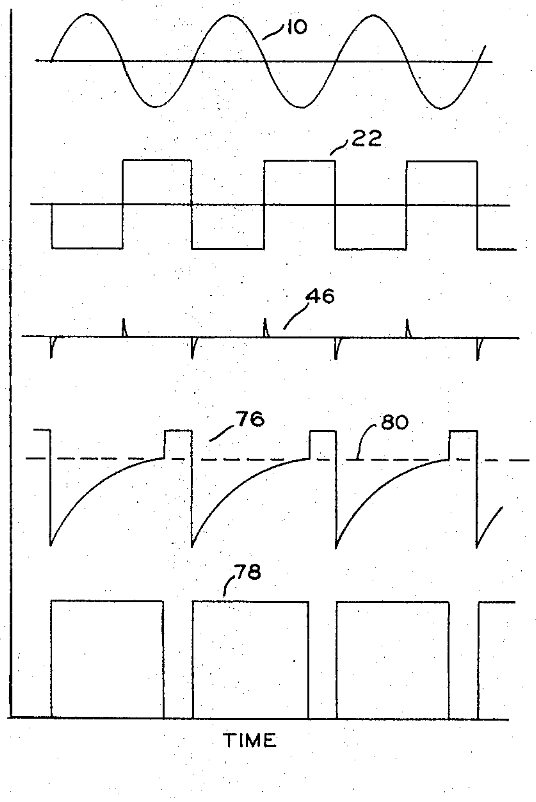
FIG. 3 is a waveform chart illustrating operation of the circuit of FIG. 1 at a lower frequency than that of FIG. 2.

The operation of the present invention will be further discussed with reference to the waveform chart of FIG. 3. The input waveform 10 and the clipped version thereof 22 are again illustrated. The frequency of the input is, in this illustration, less than the frequency of input which is to be detected by the frequency selective circuit according to the present invention. The clipped wave 22 is differentiated by the circuit including capacitor 24 and resistors 42 and 44 to produce triggering signals 46. Since the transistor 26 of the multivibrator is normally conducting, a positive-going triggering signal will have no effect thereon. However, a negative-going triggering signal operates to render transistor 26 nonconducting and thereby switches the multivibrator to its quasi-stable state. At this time, the base of transistor 26 is driven quite negative by capacitor 40 as illustrated by waveform 76. At the same time, a positive-going output is produced at the base of transistor 28, illustrated by waveform 78.

The duration of the quasi-stable state for the multivibrator, constituting the duration of its cycle of operation, is determined by the time constant of the R–C circuit comprising capacitor 40 and resistors 42 and 44 as hereinbefore mentioned. As the capacitor 40 discharges, the voltage at the base of transistor 26 rises until it reaches the cut-off value for transistor 26 indicated by dashed line 80. At this point transistor 26 resumes conduction, concluding the operating cycle or quasi-stable state for the multivibrator. At this time also the essentially square wave output 78 concludes. At the next occurrence of the negative-going triggering signal, the cycle repeats, producing another square wave output at the base of transistor 28.

Figure 2:
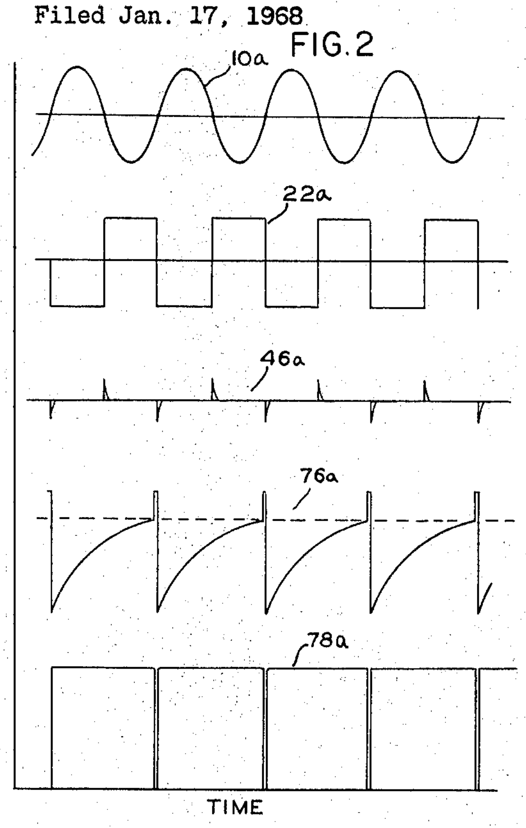
FIG. 2 is a waveform chart illustrating operation of the FIG. 1 circuit at one frequency.

The integrating means comprising resistors 56 and 58 and capacitor 60 produces a substantially steady voltage at the gate electrode of silicon-controlled rectifier 62, proportional to the cumulative time during which the multivibrator is in its quasi-stable state. As the frequency of the input waveform increases and triggering pulses become more closely spaced, so do the output pulses 78. The cumulative output increases with frequency until some predetermined spacing is reached. In the case of the illustrated embodiment, the highest integrated output is produced when the multivibrator becomes triggered into operation at approximately the same time as the previous cycle of operation is concluding. This case is illustrated by the waveform chart of FIG. 2 in which waveforms **10*a*, 22*a*, 46*a*, 76*a*, and 78*a* corresponding to previously numbered waveforms of FIG. 3 hereinbefore discussed. The frequency of waveform 10*a* is such that triggering of the multivibrator into its quasi-stable state takes place immediately after the multivibrator recovers from a previous operating cycle. Thus, as the capacitor 40 discharges through resistors 42 and 44 to bring transistor 26 above cut-off, another negative-going triggering signal is received. As a result, a number of positive-going output pulses 78***a* are produced, and in the limit, the output at the base of transistor 28 is a substantially steady voltage of the same value as the amplitude of pulses 78*a*. The frequency of waveform 10*a* will thus produce the highest integrated voltage in the integrating means for application to the gate electrode of silicon-controlled rectifier 62. The biasing of silicon-controlled rectifier 62 may be adjusted by variable resistor 70 so that silicon-controlled rectifier 62 will produce an output at terminal 74 only for a selected high value of voltage on its gate electrode. An output from the rectifier will then be produced only for an input at a selected frequency or range of input frequencies near the frequency of waveform 10*a*.

For input waveform frequencies substantially greater than that of waveform 10*a*, it will be appreciated that the multivibrator will not recover in time to be reactivated by the next negative-going triggering signal, whereby the voltage at the rectifier gate electrode drops. However, if this fact alone were depended upon to produce frequency selection, an ambiguity would result. An output would also be produced for each harmonic or multiple of a selected input frequency. That is, any input waveform supplying negative-going impulses in phase with those illustrated at 46*a* would also produce maximum output.

Figure 4:
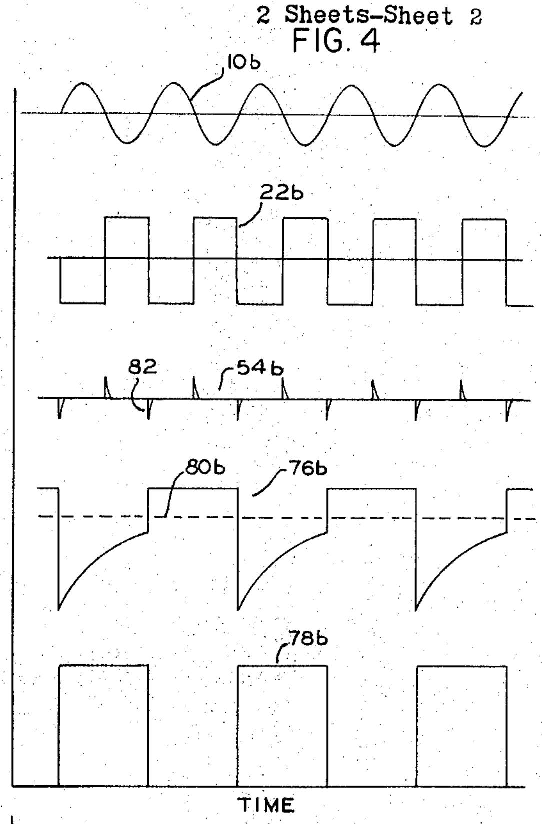
FIG. 4 is a waveform chart illustrating the operation of the circuit of FIG. 1 at a higher frequency than that of FIG. 2.

In accordance with the present invention, however, a reset circuit, including capacitor 48 and resistor 52 forming a differentiating means, provides triggering signals 54 for application to the base of transistor 28 through diode 50. This circuit acts to reset the multivibrator from its quasi-stable state to its stable state for concluding its cycle of operation before the normal recovery time thereof. This type of operation is illustrated by the waveform chart of FIG. 4 in which the waveforms 10*b*, 22*b*, 46*b*, 76*b*, and 78*b*, corresponding to similarly numbered waveforms of FIGS. 2 and 3 hereinbefore discussed. Input waveform 10*b* has a frequency higher than the frequency to be selected by the circuit according to the present invention. Again, clipped version 22*b* produces triggering signals 54*b* as well as triggering signals 46*b* (not shown) which are substantially identical to triggering signals 54*b*. The multivibrator is triggered into its quasi-stable state of operation as indicated from waveforms 76*b* and 78*b* for every other negative-going triggering signal. It is noted that the waveform 76*b* produced at the base of transistor 26 has not reached the cut-off value 80*b* by the time an intervening negative-going triggering signal 82 is received. However, the last mentioned negative-going triggering signal is coupled through diode 50 to conclude the duration of the operation cycle or quasi-stable state of the multivibrator prematurely or before discharge of capacitor 40 to cut-off value 80*b*. The multivibrator is thereby shut off. It will be appreciated that the multivibrator will be triggered into operation for every other negatice-going triggering signal, with the intervening negative-going triggering signals having the opposite effect. Therefore, an output 78*b* is produced which is present approximately half the time, for the case when input frequencies are above the selected frequency. Integration of waveform 78*b* by the integrating means, comprising resistors 56 and 58, and capacitor 60, will produce a value at the gate electrode of silicon-controlled rectifier 62 approximately half the maximum value. It is important to note that the same waveform will be applied to the integrating means for all frequencies above the selected frequency, that is above the frequency previously illustrated by waveform 10*a*. Thus, alternate negative-going triggering signals will turn the multivibrator alternately off and on, even though the input frequency is some multiple or harmonic of the selected frequency. Therefore, a false output or triggering of silicon-controlled rectifier 62 is not produced for such harmonics.

Figure 5:
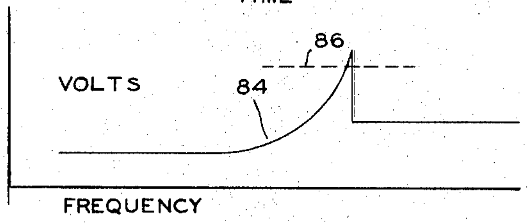
FIG. 5 is a chart showing a characteristic of the circuit of FIG. 1 as a function of frequency.

A response curve for the variation of voltage at the gate electrode of silicon-controlled rectifier 62 with frequency is illustrated at 84 in FIG. 5. It is seen that the gate voltage increases with frequency until a maximum value is reached corresponding to the selected frequency, after which such voltage drops in half. Triggering of the silicon-controlled rectifier 62 takes place in accordance with the bias values set by variable resistor 70 and as indicated by dashed line 86 in FIG. 5. The silicon-controlled rectifier will conduct and produce an output for a range of frequencies depending on this setting of variable resistor 70. As the resistance of resistor 70 is increased in value, dropping the voltage at the cathode of silicon-controlled rectifier 62, the bias indicated by the position of the dashed line 86 will be effectively lowered so that triggering of the silicon-controlled rectifier takes place for a wider band of frequencies extending between the crossings of dashed line 86 and the response curve. If the value of resistor 70 is decreased, raising the voltage at the cathode of silicon-controlled rectifier 62, dashed line 86 will in effect be raised, reducing the band of input frequencies which will produce triggering of the silicon-controlled rectifier. Thus, the circuit has variable selectivity as controlled by the SCR biasing.

In practice, the present circuit is found to be quite selective. A five percent change in frequency will produce a voltage change, for example, from .7 to .85 volt, at the peak of curve 84. Then, if the frequency is increased further, the voltage drops approximately in half. This significant and measurable change can be easily applied to operate the silicon-controlled rectifier or other means that might be substituted therefor, e.g. another monostable multivibrator, a biased differential amplifier, or the like.

Typical frequencies which may be selected by this circuit range from portions of cycles per second to hundreds of thousands of cycles per second. The frequency at which selection occurs is here determined by adjustment of the multivibrator feedback coupling means. In the present circuit, then, resistor 42 is adjusted to change the normal duration of the quasi-stable state or operating cycle for the multivibrator and thus change the frequency of selection of the present circuit. In the specific example, the frequency selected will have a period substantially equal to the duration of the multivibrator's quasi-stable state.

The silicon-controlled rectifier can be employed in the circuit as shown to produce an output voltage, or can be used in this or other circuits to energize another portion of a radio receiver. The silicon-controlled rectifier can be used to close relays and perform functions such as the sounding of a paging alarm. In addition, the output may be used to select different charging resistors in the feedback coupling means, i.e. resistor 42 or 44, during a subsequent frequency selective operation. Thus, the circuit output may be used to change the circuit's frequency susceptibility, for employing the same circuit to detect more than one modulation frequency in a paging code sequence. Furthermore, the output may provide the basis for a bandpass filter system, e.g. for selecting the circuit input or the alternating output of the multivibrator and providing the same as a circuit output when the input falls within a given selected frequency range. Such output may be gated by a silicon-controlled rectifier or a similar circuit element. Other uses of the circuit will occur to those skilled in the art.

The circuit according to the present invention may be miniaturized within a radio receiver by utilizing integrated circuits or the like for substantially all of the transistor circuitry illustrated in FIG. 1. No bulky audio frequency selective components are used as in the usual system. Thus, a single frequency selective network is achieved wherein the frequency may be accurately selected without ambiguity and without the usual tuned circuit elements.

While I have shown and described a preferred embodiment of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A frequency selective circuit for receiving an alternating current input and producing a circuit output when the alternating current input frequency falls within a predetermined range comprising:

triggerable means for producing an output of predetermined duration during each cycle of operation thereof, means repetitively responsive to said alternating current input to provide triggering signals in timed relation therewith for successively initiating operating cycles of said triggerable means, and means responsive to the output of said triggerable means for producing a circuit output as the frequency of the alternating current input increases causing the spacing between said triggering signals to decrease and approach a predetermined time period, thereby causing an increase in the cumulative time during which said triggerable means is operated, said triggerable means also being responsive to triggering signals in timed relation with said alternating current input for concluding a cycle of operation of said triggerable means at a time before the end of said predetermined duration when the frequency of said input increases so that said spacing is less than said predetermined time period.

2. A frequency selective circuit for receiving an alternating current input and producing a circuit output when the alternating current input frequency falls within a predetermined range comprising:

triggerable means for normally producing an output of predetermined duration during each cycle of operation thereof, means repetitively responsive to said alternating current input to produce triggering signals in timed relation therewith for successively initiating operating cycles of said triggering means, and means cumulatively responsive to an output of said triggerable means for providing an indication as the frequency of the alternating current increases causing the spacing between triggering signals to decrease and approach said predetermined duration, said triggerable means also being responsive to triggering signals in timed relation with said alternating current input for concluding a cycle of operation of said triggerable means at a time before the end of said predetermined duration when the frequency of said input increases to the point where said spacing thereof is less than said predetermined duration.

3. The circuit according to claim 2 wherein said cumulatively responsive means comprises integrating means, and wherein said circuit further includes means responsive to the voltage level reached by said integrating means for producing a circuit output.

4. The circuit according to claim 3 wherein said means responsive to a voltage level reached by said integrating means includes a silicon-controlled rectifier having a gate electrode coupled to said integrating means.

5. The circuit according to claim 4 further including variable means for adjusting the operating bias of said silicon-controlled rectifier.

6. A frequency selective circuit for receiving an alternating current input and producing a circuit output when the alternating current input frequency falls within a predetermined range comprising:

monostable multivibrator means for normally producing an output of predetermined duration during each cycle of operation thereof and provided with feedback coupling means for determining such duration and for determining the frequency response of said frequency selective circuit, means repetitively responsive to said alternating current input to provide triggering signals for successively initiating operating cycles of said monostable multivibrator, means cumulatively responsive to an output of said monostable multivibrator for providing an indication as the frequency of the alternating current input increases causing the spacing between said triggering signals to decrease and approach said predetermined duration, and reset circuit means responsive to said alternating current input for providing triggering signals substantially in phase with said first mentioned triggering signals for concluding a cycle of operation of said monostable multivibrator at a time before the conclusion of said predetermined duration, when the frequency of said input increases to the point where said spacing is less than said predetermined duration.

7. The circuit according to claim 6 wherein said monostable multivibrator comprises a pair of controlled devices cross-coupled for monostable multivibrator operation including said feedback coupling means therebetween, said means repetitively responsive to said alternating current input comprising input limiting means and differentiating means for applying triggering signals to respective control electrodes of said controlled devices.

8. The circuit according to claim 7 wherein said differentiating means comprise first and second differentiating means, a first of which applies triggering signals to a control electrode of a first controlled device in a sense to cause the multivibrator to assume its quasi-stable state, and a reset circuit including the second of said differentiating means for applying a reset triggering signal to the control electrode of a second controlled device in a sense for causing the multivibrator to reassume its stable state.

9. The circuit according to claim 8 further including a diode coupled between the second differentiating means and the control electrode of the second controlled device for inhibiting a polarity of triggering signals from reaching said second control device that would tend to cause the multivibrator to assume its quasi-stable state.

10. The circuit according to claim 6 wherein said feedback coupling means comprises a capacitor and resistor discharge circuit, said resistor being variable to vary the frequency response of said frequency selective circuit.

References Cited

UNITED STATES PATENTS

| | | | |
|---|---|---|---|
| 2,541,038 | 2/1951 | Cleeton | 328—109 |
| 2,857,587 | 10/1958 | Tollefson et al. | 340—167 XR |
| 3,184,606 | 5/1965 | Ovenden et al. | 307—233 |
| 3,305,732 | 2/1967 | Grossman et al. | 328—138 XR |

STANLEY T. KRAVCZEWICZ, Primary Examiner

U.S. Cl. X.R.

307—246, 295; 328—138

PO-1050
(5/69)

UNITED STATES PATENT OFFICE
CERTIFICATE OF CORRECTION

Patent No. 3,539,827 Dated November 10, 1970

Inventor(s) Dale A. Crowe

It is certified that error appears in the above-identified patent and that said Letters Patent are hereby corrected as shown below:

Column 3, line 32, "integrating" should be omitted. Column 3 line 37, after "rectifier 62" insert --, the resistor 56 and capacitor 60 being an integrating circuit and the resistor 58 being a decoupling resistor--. Column 3, line 44, "cathode" sl read --anode--. Column 4, line 18, "resistors" should read --resistor--. Column 4, line 18, "and 58" should be omitted. Column 4, line 19 (first instance) "the" should read --The--. Column 4, line 59, "and 58" should be omitted.

SIGNED AND SEALED

FEB 23 1971

(SEAL)
Attest:

Edward M. Fletcher, Jr.
Attesting Officer

WILLIAM E. SCHUYLER, JR.
Commissioner of Patents